(12) United States Patent
Agarwal et al.

(10) Patent No.: US 12,525,573 B2
(45) Date of Patent: Jan. 13, 2026

(54) PARTITIONING WAFER PROCESSING AND HYBRID BONDING OF LAYERS FORMED ON DIFFERENT WAFERS FOR A SEMICONDUCTOR ASSEMBLY

(71) Applicant: ADVANCED MICRO DEVICES, INC., Santa Clara, CA (US)

(72) Inventors: Rahul Agarwal, Livermore, CA (US); Chandra Sekhar Mandalapu, Austin, TX (US); Raja Swaminathan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 547 days.

(21) Appl. No.: 17/896,746

(22) Filed: Aug. 26, 2022

(65) Prior Publication Data
US 2024/0071985 A1    Feb. 29, 2024

(51) Int. Cl.
*H01L 23/00*    (2006.01)
*H01L 25/065*    (2023.01)

(52) U.S. Cl.
CPC .............. *H01L 24/80* (2013.01); *H01L 24/08* (2013.01); *H01L 25/0657* (2013.01); *H01L 2224/08145* (2013.01); *H01L 2224/80895* (2013.01); *H01L 2224/80896* (2013.01); *H01L 2225/06524* (2013.01); *H01L 2225/06527* (2013.01); *H01L 2924/381* (2013.01)

(58) Field of Classification Search
CPC .............. H01L 24/80; H01L 25/0657; H01L 2224/08145; H01L 25/50; H01L 24/08; H01L 2224/80895; H01L 2224/80896; H01L 25/16
See application file for complete search history.

(56) References Cited

U.S. PATENT DOCUMENTS

| | | | |
|---|---|---|---|
| 11,756,907 B2* | 9/2023 | Chen | H01L 23/5226 |
| | | | 257/773 |
| 11,948,902 B2* | 4/2024 | Hou | H01L 24/08 |
| 12,237,288 B2* | 2/2025 | Huang | H01L 23/3135 |
| 2014/0035158 A1* | 2/2014 | Chang | H01L 24/08 |
| | | | 438/109 |
| 2019/0066571 A1 | 2/2019 | Goward | |
| 2020/0091124 A1* | 3/2020 | Liao | G02B 6/4201 |
| 2020/0258857 A1* | 8/2020 | Huo | H01L 24/20 |
| 2021/0175192 A1* | 6/2021 | Mueller | H01L 24/03 |
| 2022/0399324 A1* | 12/2022 | Then | H01L 25/0657 |
| 2022/0415555 A1* | 12/2022 | Dogiamis | H01L 25/0657 |
| 2023/0140675 A1* | 5/2023 | Kim | H01L 22/32 |
| | | | 257/48 |

(Continued)

OTHER PUBLICATIONS

International Search Report and Written Opinion, PCT/US2023/031170, Dec. 21, 2023, 9 pages.

*Primary Examiner* — Mamadou L Diallo

(57) ABSTRACT

A method for forming a semiconductor assembly that includes forming a first set of layers on a first wafer, where one or more layers of the first set includes one or more devices of the semiconductor assembly. The method further includes forming a second set of layers on a second wafer, where one or more layers of the second set include connections between one or more of the devices of the semiconductor assembly. The method additionally includes coupling a layer of the first set to a layer of the second set using metal to metal hybrid bonding.

18 Claims, 5 Drawing Sheets

(56) References Cited

U.S. PATENT DOCUMENTS

| | | | |
|---|---|---|---|
| 2023/0260977 A1* | 8/2023 | Chen | H01L 24/82 |
| | | | 257/690 |
| 2023/0299042 A1* | 9/2023 | Chen | H10B 63/80 |
| 2023/0299049 A1* | 9/2023 | Deshpande | H01L 23/481 |
| 2023/0343769 A1* | 10/2023 | Karhade | H01L 25/0652 |
| 2023/0352367 A1* | 11/2023 | Yu | H01L 23/562 |
| 2023/0411325 A1* | 12/2023 | Singh | H01L 24/80 |
| 2023/0422520 A1* | 12/2023 | Fan | H01L 24/08 |
| 2024/0030168 A1* | 1/2024 | Chen | H01L 23/585 |
| 2024/0030169 A1* | 1/2024 | Kim | H01L 24/08 |
| 2025/0054913 A1* | 2/2025 | Chung | H01L 25/0657 |

* cited by examiner

PARTITIONING WAFER PROCESSING AND HYBRID BONDING OF LAYERS FORMED ON DIFFERENT WAFERS FOR A SEMICONDUCTOR ASSEMBLY

BACKGROUND

As numbers of components, such as transistors, increase in a semiconductor assembly, a number of layers for interconnecting the components of the semiconductor assembly also increases. Forming an increased number of layers increases a cycle time for semiconductor assembly fabrication. In addition to increasing overall time to fabricate a semiconductor assembly, increasing the number of layers interconnecting components of the semiconductor assembly increases a likelihood of manufacturing defects when creating the semiconductor assembly.

DETAILED DESCRIPTION

As numbers of components, such as transistors, included in a semiconductor assembly, the semiconductor assembly includes an increasing number of layers to connect various components. For example, a semiconductor assembly includes various metal interconnection layers to connect different components. With an increasing number of components, an increasing number of metal layers are included in the semiconductor assembly to connect different components.

While the increasing number of interconnection layers, such as metal interconnection layers, enables increased power or performance for a semiconductor assembly, increasing the number of interconnection layers also increases a cycle time for fabricating the semiconductor assembly. Further, increasing the number of interconnection layers increases a likelihood of manufacturing defects from creation of the interconnection layers. Additionally, conventional methods for creating interconnection layers subject components of the semiconductor assembly to heat, so increasing the number of interconnection layers increases an amount of heat exposure for components of the semiconductor assembly, which may affect subsequent performance of the components of the semiconductor assembly.

Figure 1:
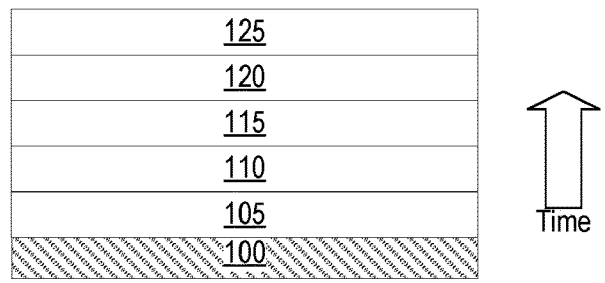
FIG. 1 is a cross-section of a conventional manufacturing process for a semiconductor assembly.

FIG. 1 is cross-section of a conventional manufacturing process for a semiconductor assembly. As shown in FIG. 1, layers 105-125 are applied to a wafer 100. In various implementations, the first wafer 100 comprises materials such as silicon, silicon dioxide, gallium arsenide, aluminum oxide, or other suitable materials. A subset of the layers 105-125 are layers where devices, such as transistors, capacitors, and resistors, forming the semiconductor assembly are formed. For example, layers 105 and 110 are layers in which the devices comprising the semiconductor assembly are formed. The other layers applied to the wafer 100 include connections between devices comprising the semiconductor assembly. In the example of FIG. 1, layers 115-125 include connections between the devices in the semiconductor assembly. The layers 115-125 include conductive material, such as metal, for forming connections between devices as well as conductive pathways. In FIG. 1, each layer is applied individually, with the layers applied in series. For example, layer 110 is not applied until after layer 105 has been completely applied to the wafer 100. Similarly, layer 115 is not applied until layer 110 has been completely applied. Such sequential application of layers to the wafer 100 increases an overall time to manufacture the semiconductor assembly as the number of layers 105-125 increases. Thus, increasing a number of connections between devices increases a number of layers 115-125 including connections between devices, resulting in an increased time to manufacture the semiconductor assembly. Further, formation of layers 115-125 subject existing layers of the semiconductor assembly to heat, so that increasing the number of interconnection layers increases an amount of heat exposure to devices in the semiconductor assembly. Such an increase in heat exposer, increases a likelihood of performance degradation of the devices.

To that end, the present specification sets forth various implementations of a method in which a set of layers of a semiconductor assembly are formed on a first wafer, while a second set of layers of the semiconductor assembly are formed on a second wafer. A layer of the second set of layers is bonded to a layer of the first set of layers through hybrid bonding to form the semiconductor assembly. Forming different sets of layers on different wafers allows the method described herein to reduce overall manufacturing time by allowing different sets of layers to be formed in parallel rather than individually forming layers in series on a single wafer, as further described herein. Further, formation of different sets of layers on different wafers allows heat applied to layers including devices of the semiconductor assembly to be reduced by forming layers including devices on a separate wafer than a wafer on which one or more layers including connections between devices are formed.

The present specification sets forth various implementations for forming a semiconductor assembly that includes forming a first set of layers on a first wafer, where one or more layers of the first set includes one or more devices of the semiconductor assembly. The method further includes forming a second set of layers on a second wafer, where one or more layers of the second set include connections between one or more of the devices of the semiconductor assembly. The method additionally includes coupling a layer of the first set to a layer of the second set using metal to metal hybrid bonding.

In some implementations, the layer of the first set is coupled to one or more conductive traces included in a transition layer using metal to metal hybrid bonding. The layer of the second set is coupled to the one or more conductive traces included in the transition layer using metal to metal hybrid bonding in some implementations. In some implementations, a pitch of the one or more conductive traces included in the transition layer is different from a pitch of conductive traces included in the layer of the first set. Additionally, in some implementations, the pitch of the one or more conductive traces included in the transition layer is different from a pitch of conductive traces included in the layer of the second set.

In some implementations, the first set includes a subset of layers that include connections between devices of the semiconductor assembly. The layer of the first set comprises a layer of the subset of layers including connections between one or more of the devices of the semiconductor assembly in some implementations.

In some implementations, a layer of the second set includes at least one passive component. A passive component comprises a capacitor in some implementations. The capacitor is a super high density metal-insulator-metal capacitor in some implementations. In some implementations, the passive component comprises an inductor.

The present specification further describes a semiconductor device including a first set of layers, with one or more layers of the first set including one or more devices. The semiconductor device further includes a second set of layers, with a layer of the second set coupled to a layer of the first set using metal to metal hybrid bonding. One or more layers of the second set including connections between one or more of the devices.

In some implementations, the semiconductor device further includes a transition layer including one or more conductive traces, where the layer of the first set is coupled to the one or more conductive traces using metal to metal hybrid bonding and the layer of the second set coupled is to the one or more conductive traces using metal to metal hybrid bonding. In some implementations, a pitch of the one or more conductive traces included in the transition layer is different from a pitch of conductive traces included in the layer of the first set. Additionally, in some implementations, the pitch of the one or more conductive traces included in the transition layer is different from a pitch of conductive traces included in the layer of the second set.

In some implementations, the first set of layers includes a subset of layers having connections between one or more of the devices. The layer of the first set coupled to the second set using metal to metal hybrid bonding is a layer of the subset of layers including connections between one or more of the devices in some implementations.

In some implementations, a layer of the second set of layers includes at least one passive component. A passive component is a capacitor in some implementations. The capacitor is a super high density metal-insulator-metal capacitor in some implementations. In some implementations, the passive component comprises an inductor The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features formed between the first and second features, such that the first and second features are in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

Figure 2:
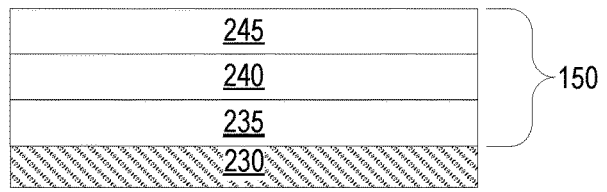
FIG. 2 is part of a process flow for manufacturing a semiconductor assembly including layers connected by a hybrid metal to metal bond according to some implementations.
Figure 2:
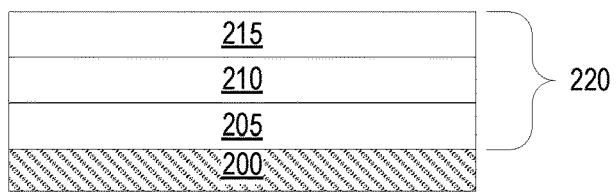
Figure 3:
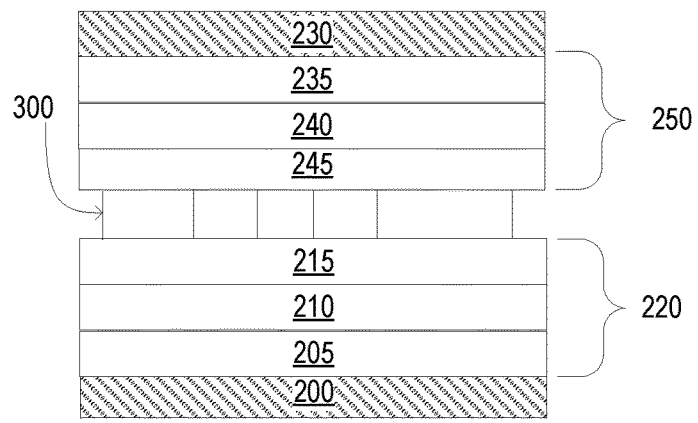
FIG. 3 is part of a process flow for manufacturing a semiconductor assembly including layers connected by a hybrid metal to metal bond according to some implementations.
Figure 4:
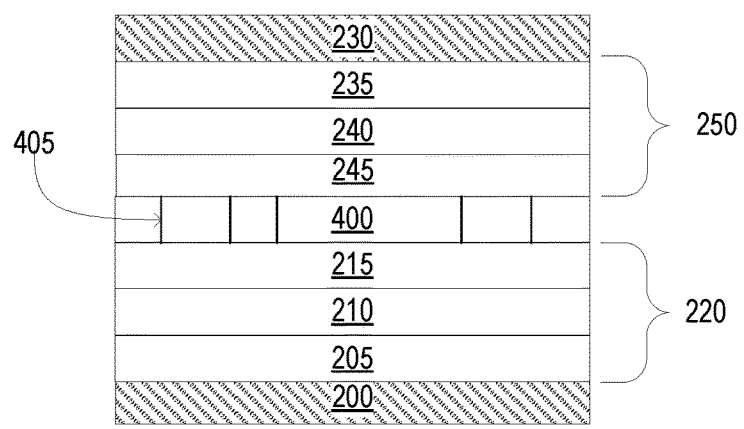
FIG. 4 is part of a process flow for manufacturing a semiconductor assembly including layers connected by a hybrid metal to metal bond and a transition layer according to some implementations.

FIGS. 2-4 show steps in an example manufacturing process for a semiconductor assembly including layers connected by a hybrid metal to metal bond. Beginning with FIG. 2, layers 205, 210, 215 are applied to a first wafer 200. In various implementations, the first wafer 200 comprises materials such as silicon, silicon dioxide, gallium arsenide, aluminum oxide, or other suitable materials. Layers 205, 210, 215 are referred to herein as a first set 220 of layers, so the first set 220 of layers is formed on the first wafer 200. One or more of the first set 220 of layers includes devices of the semiconductor assembly. Example components included in a layer of the first set 220 include transistors, resistors, capacitors, or other suitable devices. Hence, one or more layers of the first set 220 comprise "front end of line" (FEOL) layers of the semiconductor assembly corresponding to layers in a fabrication process occurring before formation of an interconnect layer, such as a metal interconnect layer, and are layers during which devices comprising the semiconductor assembly are fabricated. Hence, FEOL layers of the semiconductor assembly correspond to layers in the manufacturing process where devices (e.g., transistors, capacitors, resistors, etc.) comprising the semiconductor assembly are formed.

In some implementations, one or more layers of the first set 220 optionally are "middle of line" (MOL) layers including local connections between devices of the semiconductor assembly (e.g., devices formed in one or more FEOL layers) and one or more interconnection layers between different layers of the semiconductor assembly. For example, MOL layers include gate contacts for transistors in one or more FEOL layers as well as interconnections between different layers In some implementations, MOL layers provide connections between devices included in a FEOL layer, with one or more MOL layers allowing connections between conductive elements in a "back end of line" (BEOL) layer, further described below, to allow a tighter pitch between the conductive elements in the BEOL layer.

In some implementations, a subset of the first set 220 of layers include connections between devices, also referred to as "back end of line" (BEOL) layers. Hence, a BEOL layer is formed in the manufacturing process after layers where devices comprising the semiconductor assembly were formed (the FEOL layers further described above), with the BEOL layer including one or more connections between devices that comprise the semiconductor assembly. In various implementations, the BEOL layers begin with the first layer including connections between devices and includes subsequent layers including connections between devices. For example, one or more of the first set 220 of layers include metal connections that couple devices of the semiconductor assembly to each other. In different implementations, the first set 220 of layers includes different numbers of layers including connections between devices of the semiconductor assembly. For example, layer 205 in the example of FIG. 2 is a FEOL layer including devices of the semiconductor assembly, and layer 210 in the example of FIG. 2 is a MOL layer, while layer 215 in the example of FIG. 2 is a BEOL layer including connections between devices in layer 205. In another example, layer 205 in the example of FIG. 2 includes devices of the semiconductor assembly, while layer 210 and layer 215 include connections between devices included in layer 205.

As shown in FIG. 2, a second wafer 230 is used in the manufacturing process. The second wafer 230 is separate and different from the first wafer 200. In various implementations, the second wafer 230 comprises materials such as silicon, silicon dioxide, gallium arsenide, aluminum oxide, or other suitable materials. The second wafer 230 and the first wafer 200 are a common material in some implementations, while in other implementations the second wafer 230 and the first wafer 200 are different materials.

Layers 235, 240, and 245 are formed on the second wafer 230, and layers 235, 240, and 245 form a second set 250 of layers on the second wafer 230. In various implementations, one or more layers 235, 240, and 245 of the second set 250 include connections between devices included in one or more layers 205, 210, 215 of the first set 220. Thus, in various implementations, the second set 250 includes one or more BEOL layers. In other implementations, each layer 205, 210, 215 of the second set 250 is a BEOL layer including one or more connections between devices of the semiconductor assembly.

In various implementations, the first set 220 of layers is applied to the first wafer 200 in parallel with application of the second set 250 of layers to the second wafer 230. Such parallel formation of the first set 220 of layers on the first wafer 200 and of the second set 250 of layers on the second wafer 230 reduces an amount of time for forming the different layers 205, 210, 215, 235, 240, and 245 compared to processes where layers are sequentially formed on one another on a single wafer.

In some implementations, a number of layers included in the second set 250 is determined to increase parallel formation of layers on the second wafer 230 and layers on the first wafer 200. For example, the first set 220 of layers includes a number of BEOL layers including connections between devices of the semiconductor assembly, while the second set 250 of layers also includes a number of BEOL layers including connections between devices of the semiconductor assembly. This allows the layers including connections between devices of the semiconductor assembly to be formed in parallel on the first wafer 200 and on the second wafer 230, allowing a total number of layers including connections between devices to be increased while reducing an amount of time for forming the total number of layers including connections compared to techniques where each layer including connections is formed in series on a single wafer, as further describe above. In other implementations, FEOL layers in which the devices comprising the semiconductor assembly are formed on the first wafer 200, while BEOL layers including connections between the devices in the FEOL layers are formed on the second wafer 230. Such formation of the devices on the first wafer 200 and the connections between the devices on the second layer 230 decreases heat applied to the devices during formation of the connections between the devices, preventing degradation of the device performance from heat exposure.

In some implementations, the layers in the second set 250 of layers include a subset of layers including connections between devices of the semiconductor assembly, while the layers in the first set 230 of layers include another subset of layers including connections between devices of the semiconductor assembly. The subset of layers including connections between devices of the semiconductor assembly include a different pitch of connections than the other subset of layers in some implementations. Thus, in various implementations, the first set 230 of layers includes layers with one or more pitches of connections satisfying one or more criteria, while the second set 250 of layers includes layers with one or more pitches of connections satisfying one or more alternative criteria. However, in other implementations, inclusion of a layer including connections between devices in the first set 230 of layers of in the second set 250 of layers is based on other criteria.

In FIG. 3, a layer of the second set 250 of layers formed on the second wafer 230 is coupled to a layer of the first set 220 of layers formed on the first wafer 200. For purposes of illustration, FIG. 3 shows layer 245 of the second set 250 of layers coupled to layer 215 of the first set 220 of layers. Thus, in some implementations, a most recently formed layer of the second set 250 of layers is coupled to a most recently formed layer of the first set 220 of layers. In various implementations, layer 245 of the second set 250 of layers includes connections between devices of the semiconductor assembly and layer 215 of the first set 220 of layers includes additional connections between devices of the semiconductor assembly; hence, layer 245 and layer 215 are both BEOL layers in some implementations. The layer of the second set 250 and the layer of the first set 220 are coupled via metal to metal hybrid bonding. For example, the metal to metal hybrid bonding includes a dielectric bond with embedded connective material (e.g., metal), with the embedded connective material coupled to one or more connective traces in a layer of the first set 220 and to one or more connective traces in a layer of the second set 250. For purposes of illustration, FIG. 3 shows hybrid metal to metal bonds 300 coupling layer 245 of the second set 250 of layers to layer 215 of the first set of layers.

FIG. 4 shows an alternative coupling of a layer of the second set 250 of layers formed on the second wafer 230 is coupled to a layer of the first set 220 of layers formed on the first wafer 200. In the example of FIG. 4, a transition layer 400 is formed between the layer of the second set 250 of layers formed on the second wafer 230 and the layer of the first set 220 of layers formed on the first wafer 200. A surface of the transition layer 400 is bonded to the layer of the second set 250, while an opposite surface of the transition layer 400 is bonded to the layer of the first set 220, where the surface and the opposite surface are parallel to each other and separated by a distance. The transition layer 400 includes conductive traces 405 that comprise a conductive material (e.g., copper) included in another material, such as a dielectric material. A conductive trace, or other connection, in the layer of the first set 220 is coupled to a conductive trace 405 in the transition layer 400, with the conductive trace in the transition layer 400 coupled to another conductive trace, or other connection, in the layer of the second set 250. In various implementations, the transition layer 400 includes multiple conductive traces 405, allowing coupling of different conductive traces in the layer of the first set 220 to different conductive traces in the layer of the second set 250. A conductive trace 405 in the transition layer 400 is coupled to a conductive trace in the layer of the first set 220 using a hybrid metal to metal bond, as further described above. Similarly, the conductive trace 405 in the transition layer 400 is coupled to a conductive trace 405 in the layer of the second set 250 using a hybrid metal to metal bond to couple the conductive trace in the layer of the first set 220 to the conductive trace in the layer of the second set 250 via the conductive trace 405 in the transition layer 400.

Figure 5:
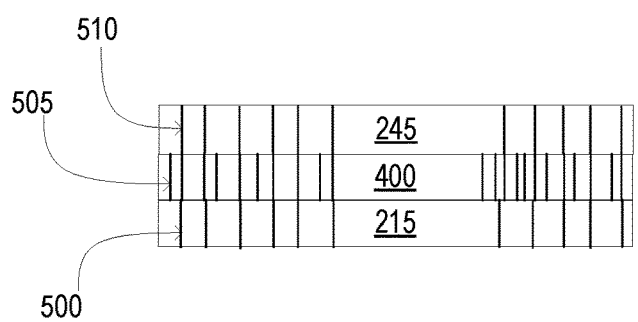
FIG. 5 is a cross-section of an example coupling of conductive traces in different layers to conductive traces in a transition layer according to some implementations.

FIG. 5 shows a cross-section of an example coupling of conductive traces in different layers to conductive traces in a transition layer 400. For purposes of illustration, FIG. 5 shows layer 215 from the first set 220 of layers coupled to the transition layer 400 and layer 245 from the second set 250 of layers coupled to the transition layer 400. As shown in FIG. 5, layer 215 includes conductive traces 500. Similarly, the transition layer 400 includes conductive traces s, and layer 245 includes conductive traces 510. In the implementation shown by FIG. 5, a pitch between conductive traces 505 in the transition layer 400 is different than a pitch between conductive traces 500 in layer 215 and is different than a pitch between conductive traces 510 in layer 245. In other implementations, the pitch between conductive traces 500 in layer 215 differs than at least one of a pitch between conductive traces 500 in layer 215 and a pitch between conductive traces 510 in layer 245. For example, a pitch between conductive traces 500 in the transition layer 400 is less than a pitch between conductive traces 500 in layer 215 and a pitch between conductive traces 510 in layer 245. In the preceding example, the reduced pitch between conductive traces 500 in layer 215 allows the transition layer 400 to fanout a pitch between conductive traces in one of layer 215 and layer 245 to facilitate hybrid metal to metal bonding then transition back to a pitch corresponding to the pitch between conductive traces in layer 215 or in layer 245.

Figure 6:
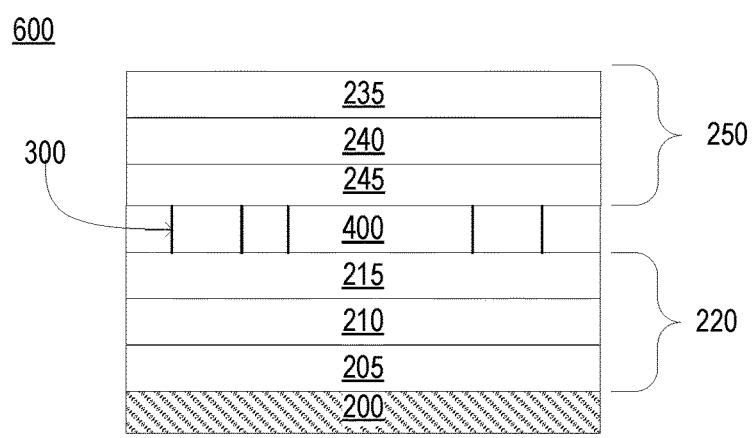
FIG. 6 is an example semiconductor assembly including layers connected by a hybrid metal to metal bond according to some implementations.

Referring to FIG. 6, an example semiconductor assembly 600 including layers connected by a hybrid metal to metal bond is depicted. In the example shown by FIG. 6, the semiconductor assembly includes the first wafer 200 and the first set 220 of layers formed on the first wafer 200. In the example of FIG. 6, layer 215 of the first set of layers is coupled to a transition layer 400, with the transition layer 400 coupled to layer 245 of the second set 250 of layers formed on the second wafer 230, as shown in FIGS. 2 and 2. Conductive traces in layer 215 are bonded to conductive traces in the transition layer 400 using hybrid metal to metal bonding, with the conductive traces in the transition layer 400 coupled to conductive traces in layer 245 using hybrid metal to metal bonding. However, in other implementations, conductive traces in layer 215 are directly bonded to conductive traces in layer 245 using hybrid metal to metal bonding, so layer 215 is directly bonded to layer 245 without the transition layer 400. The remaining layers in the second set 250 of layers are also included in the semiconductor assembly 600 as a result of coupling layer 215 to layer 245. As shown in FIG. 6, the second wafer 230 on which the second set 250 of layers was formed is removed when the semiconductor assembly 600 after layer 215 is bonded to layer 245.

Figure 7:
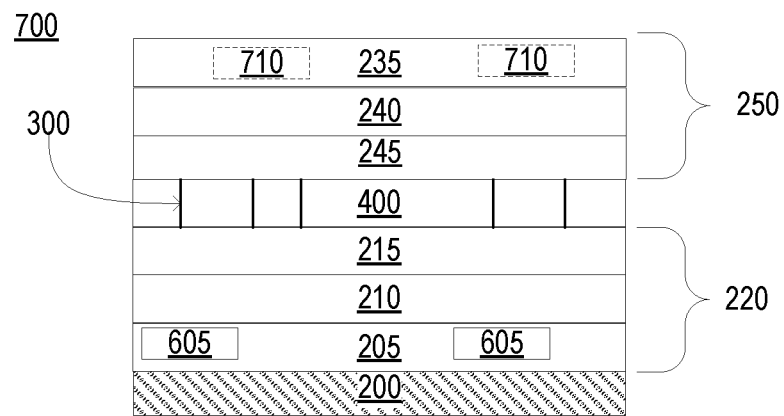
FIG. 7 is another example semiconductor assembly including layers connected by a hybrid metal to metal bond according to some implementations.

FIG. 7 shows another example semiconductor assembly 700 including layers connected by a hybrid metal to metal bond is depicted. In FIG. 7, one or more devices 705 comprising the semiconductor assembly 700 are shown in a layer 205 of the first set 220 of layers. For example, the devices 705 comprise one or more transistors. However, one or more of the devices 705 are other components (e.g., resistors, capacitors, etc.) in various implementations. In various implementations, at least one of the devices 705 is an active device (e.g., a transistor, a diode, etc.). Different devices 705 are connected to each other through one or more of the layers in the first set 220 of layers, through one or more of the layers in the second set 250 of layers, or through a combination of layers in the first set 220 of layers and in the second set 250 of layers in various implementations. Hence, one of more layers of the second set 250 of layers include conductive traces configured to be coupled to one or more devices 705. In some implementations, a subset of the first set 220 of layers also include conductive traces configured to be coupled to one or more devices 705.

Figure 8:
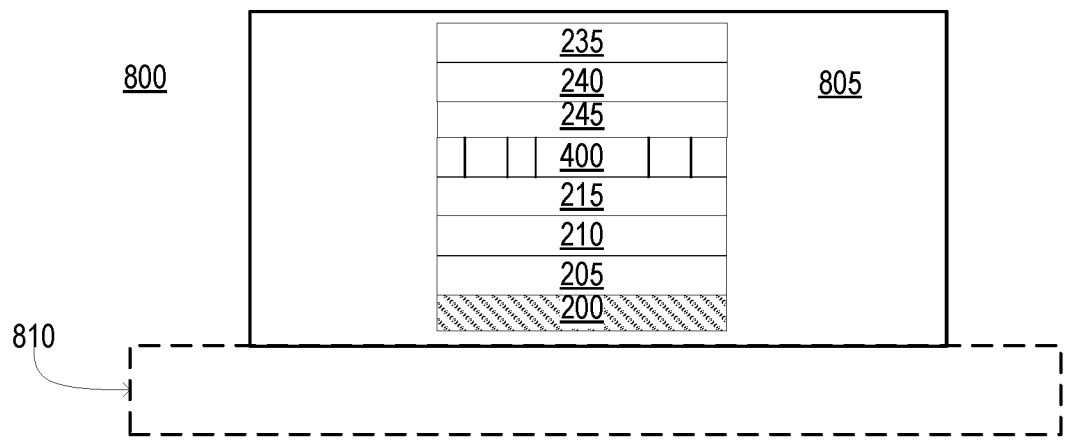
FIG. 8 is a cross-sectional diagram of an example integrated circuit device including a semiconductor assembly including layers connected by a hybrid metal to metal bond according to some implementations.
Figure 9:
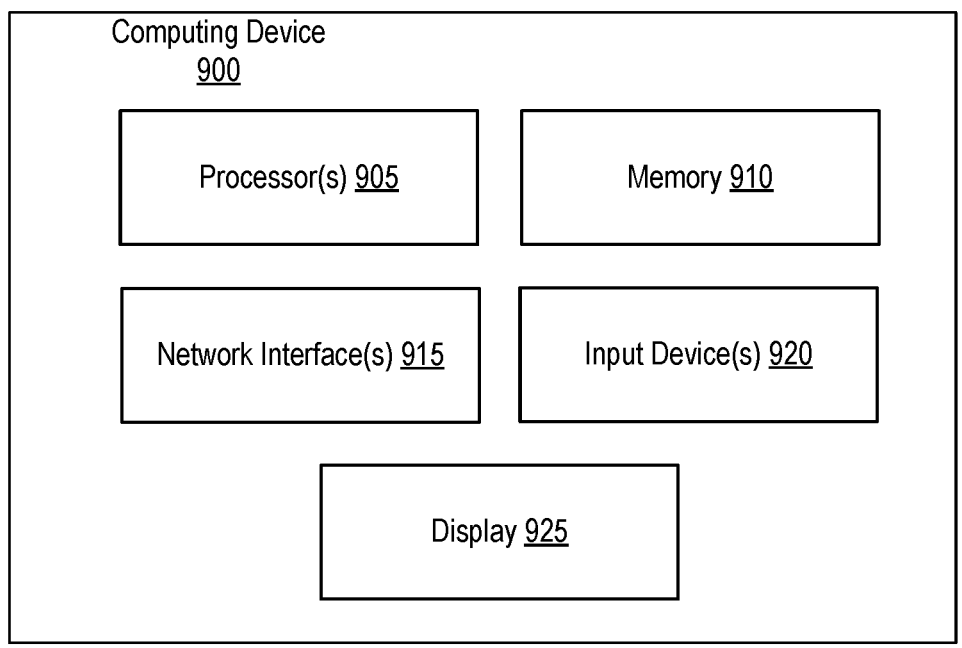
FIG. 9 is an example computing device according to some implementations.

In the example semiconductor assembly 700 shown in FIG. 7, one or more layers of the second set 250 of layers include one or more passive components 710, for purposes of illustration. Example passive components 710 include a capacitor, a resistor, an inductor, or other suitable device. For example, a passive component 710 is a capacitor in some implementations. In a more specific example, a passive component 710 is a super high density metal-insulator-metal capacitor. However, different passive components 710 or combinations of passive components 710 are included in one or more layers of the second set 250 of layers in different implementations. Passive components 710 are connected to each other or are connected to devices 705 through one or more of the layers in the second set 250 of layers or through a combination of layers in the first set 220 of layers and in the second set 250 of layers in various implementations. Hence, one of more layers of the second set 250 of layers include conductive traces configured to be coupled to one or more devices 705 or to one or more passive components 710. In some implementations, a subset of the first set 220 of layers also include conductive traces configured to be coupled to one or more devices 705 or to be coupled to one or more passive components 710. Inclusion of passive components 710 in one or more layers of the second set 250 is optional in different implementations. Including the one or more passive components 710 in one or more layers of the second set 250 of layers allows the passive components 710 to be included without lengthening cycle time for manufacturing the semiconductor assembly 700, as the passive components 710 are capable of being included in layers that are formed on a separate wafer than a wafer on which the devices 705 and layers in the first set 220 of layers are formed, in contrast with sequential formation of layers on a single wafer, where the passive components 710 are formed in the last layers that include interconnections between device of a semiconductor assembly, which increases an overall time to complete fabrication of the semiconductor assembly.

is a cross-sectional diagram of an example integrated circuit device 800 including semiconductor assembly including layers connected by a hybrid metal to metal bond in accordance with some implementations of the present disclosure. The example integrated circuit device 800 can be implemented in a variety of computing devices, including mobile devices, personal computers, peripheral hardware components, gaming devices, set-top boxes, smart phones, and the like (as shown in FIG. 9). The example integrated circuit device 800 of FIG. 8 includes a die 805. The die 805 is a block of semiconducting material such as silicon onto which a functional integrated circuit is fabricated. As an example, the die 805 includes a processor such as a Central Processing Unit (CPU), a Graphics Processing Unit (GPU), or other processor as can be appreciated. In various implementations, the die 805 includes a semiconductor assembly including layers connected by a hybrid metal to metal bond, as further described above in conjunction with FIGS. 2-6

As an example, the die 805 includes a processor 905 of a computing device 900 as shown in FIG. 9. The computing device 900 is implemented, for example, as a desktop computer, a laptop computer, a server, a game console, a smart phone, a tablet, and the like. In addition to one or more processors 905, the computing device 900 includes memory 910. The memory 910 includes Random Access Memory (RAM) or other volatile memory. The memory 910 also includes non-volatile memory such as disk storage, solid state storage, and the like.

In some implementations, the computing device 900 also includes one or more network interfaces 915. In some implementations, the network interfaces 915 include a wired network interface 915 such as Ethernet or another wired network connection as can be appreciated. In some implementations, the network interfaces 915 include wireless network interfaces 915 such as WiFi, BLUETOOTH®, cellular, or other wireless network interfaces 915 as can be appreciated. In some implementations, the computing device 900 includes one or more input devices 920 that accept user input. Example input devices 920 include keyboards, touchpads, touch screen interfaces, and the like. One skilled in the art will appreciate that, in some implementations, the input devices 920 include peripheral devices such as external keyboards, mice, and the like.

In some implementations, the computing device 900 includes a display 925. In some implementations, the display 925 includes an external display connected via a video or display port. In some implementations, the display 925 is housed within a housing of the computing device 900. For example, the display 925 includes a screen of a tablet, laptop, smartphone, or other mobile device. In implementations where the display 925 includes a touch screen, the display 925 also serves as an input device 920.

The die 805 is coupled to a substrate 810. The substrate 810 is a portion of material that mechanically supports coupled components such as the die 805. In some implementations, the substrate 810 also electrically couples various components mounted to the substrate 810 via conductive traces, tracks, pads, and the like. For example, the substrate 810 electrically couples a component of the die 805 to one or more other components via a connective trace and a solder joint formed from a solder ball coupled to a conductive pad. In some implementations, the substrate 810 includes a printed circuit board (PCB), while in other implementations the substrate 810 is another semiconductor device, like die 805 (which may include active components therein). In some implementations, the die 805 is coupled to the substrate 810 via a socket (not shown), where the die 805 is soldered to or otherwise mounted in the socket. In other implementations, as shown in FIG. 8, the die 805 is directly coupled to the substrate 810 via a direct solder connection or other connection as can be appreciated. In some implementations, the die 805 is coupled to the substrate 810 using a land grid array (LGA), pin grid array (PGA), or other packaging technology as can be appreciated.

Figure 10:
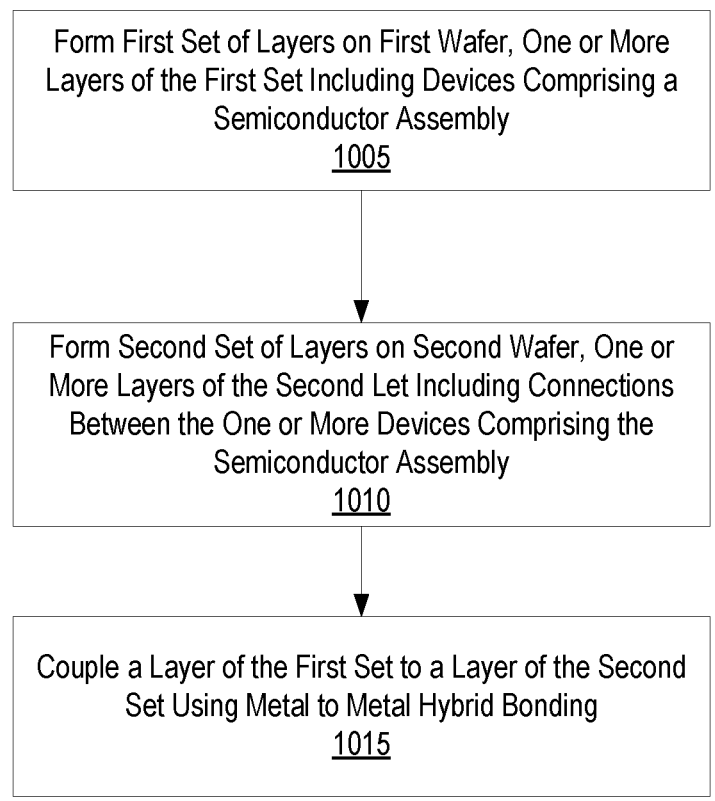
FIG. 10 is a flow chart illustrating an example method for manufacturing an integrated circuit device assembly including layers connected by a hybrid metal to metal bond according to some implementations.

For further explanation, FIG. 10 sets forth a flow chart illustrating an example method for manufacturing an integrated circuit device assembly including layers connected by a hybrid metal to metal bond. The method shown in FIG. 10 includes forming 1005 a first set 220 of layers on a first wafer 200, as shown above in conjunction with FIG. 2. One or more layers of the first set 220 include devices comprising the integrated circuit device assembly. For example, a layer of the first set 220 includes one or more transistors. In various implementations, other devices, such as resistors, capacitors, diodes, inductors, or other devices, are included in a layer of the first set. In various implementations, different devices or combinations of devices comprising the integrated circuit device assembly are included in a layer formed 1005 on the first wafer 200. Different numbers of layers of the first set 220 include devices comprising the integrated circuit device assembly in various implementations. In some implementations, a subset of layers of the first set 220 include connections between devices that comprise the integrated circuit device assembly.

A second set 250 of layers is formed 1010 on a second wafer 230, with one or more layers of the second set 250 including connections between devices comprising the integrated circuit device assembly. The second wafer 230 is different from the first wafer 200, so the first set of layers and the second set of layers are each formed on different wafers. For example, one or more layers of the second set 250 include conductive traces configured to couple a connection of a device comprising the integrated circuit device assembly in a layer of the first set 220 to another device included in the layer of the first set 220 (or to another device in a different layer of the first set 220). In some implementations, a layer of the second set 250 includes connections for coupling a device of a layer of the first set 220 to a component in a layer of the second set 250. Formation of the second set 250 of layers is further described above in conjunction with FIG. 2.

In some implementations, one or more layers of the second set 250 include one or more passive components, as further described above in conjunction with FIG. 7. Example passive components include a capacitor, a resistor, an inductor, or other suitable device. For example, a passive component is a capacitor in some implementations. In a more specific example, a passive component is a super high density metal-insulator-metal capacitor. However, different passive components or combinations of passive components are included in one or more layers of the second set 250 of layers in different implementations. One or more layers of the second set 250 include connections between passive components or between passive components and one or more devices included in one or more layers of the first set 220 in various implementations. The passive components are included in multiple layers of the second set 250 in some implementations.

A layer of the second set 250 is coupled 1015 to a layer of the first set 220 using metal to metal hybrid bonding. For example, the metal to metal hybrid bonding includes a dielectric bond with embedded connective material (e.g., metal), with the embedded connective material coupled to one or more connective traces in a layer of the first set 220 and to one or more connective traces in a layer of the second set 250. In some implementations, the layer of the first set 220 is directly coupled to the layer of the second set 250 using metal to metal hybrid bonding. In other implementations, conductive traces in the layer of the first set 220 are coupled to one or more conductive traces included in a transition layer 400 using metal to metal hybrid bonding, and conductive traces in the layer of the second set 250 are coupled to one or more conductive traces included in the transition layer 400 using metal to metal hybrid bonding. In such implementations, the layer of the first set 220 is coupled to the transition layer 400, which is also coupled to the layer of the second set 250, as shown above in conjunction with FIG. 4. In various implementations, a pitch of the conductive traces in the transition layer 400 differs from a pitch of conductive traces in the layer of the first set 220 or differs from a pitch of conductive traces in the layer of the second set 250. In some implementations, the pitch of conductive traces included in the transition layer 400 differs from a pitch of conductive traces included in the layer of the first set 220 and differs from a pitch of conductive traces included in the layer of the second set 250, as further described above in conjunction with FIG. 5.

In implementations where the first set 220 of layers includes a subset of layers that include connections between the devices comprising the integrated circuit device assembly, the layer of the first set 220 coupled 1015 to the layers of the second set 250 is a layer of the subset that includes connections between the devices comprising the integrated circuit device assembly. Such implementations allow a subset of connections between devices comprising the integrated circuit device assembly to be established via the first set 220 of layers, while establishing additional connections between c devices comprising the integrated circuit device assembly using layers of the second set 250 of layers. This allows an increased number of connections between devices comprising the integrated circuit device assembly to be established without increasing a time to fabricate the integrated circuit device assembly by forming the first set 220 of layers on a first wafer 200 while forming the second set 250 of layers on a different second wafer 230.

In view of the explanations set forth above, readers will recognize that manufacturing an integrated circuit device assembly including a layer from a first set formed on a first wafer coupled, using metal to metal hybrid bonding, to a layer from a second set formed on a second wafer allows an increasing number of connections between devices comprising the integrated circuit device assembly to be formed without a significant increase in fabrication time for the integrated circuit device assembly. Such manufacturing allows different layers of the integrated circuit device assembly to be formed in parallel on different wafers and coupling layers formed on different wafers to each other using metal to metal hybrid bonding. Additionally, forming different sets of layers on different wafers prevents degradation of devices comprising the integrated circuit device assembly by reducing an amount of time the devices are exposed to heat when forming layers having interconnections between devices, as one or more of the layers with interconnections between devices are formed on a wafer separate than the wafer including the devices comprising the integrated circuit device assembly.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A method for forming a semiconductor assembly comprising:
   forming a first set of layers on a first wafer, one or more layers of the first set including one or more devices of the semiconductor assembly;
   forming a second set of layers on a second wafer, one or more layers of the second set including connections between one or more of the devices of the semiconductor assembly; and
   coupling a layer of the first set to a layer of the second set using metal to metal hybrid bonding, including:
   coupling the layer of the first set to one or more conductive traces included in a transition layer using metal to metal hybrid bonding; and
   coupling the layer of the second set to the one or more conductive traces included in the transition layer using metal to metal hybrid bonding.

2. The method of claim 1, wherein forming the first set of layers on the first wafer and forming the second set of layers on the second wafer is carried out in parallel.

3. The method of claim 1, wherein a pitch of the one or more conductive traces included in the transition layer is different from a pitch of conductive traces included in the layer of the first set.

4. The method of claim 3, wherein the pitch of the one or more conductive traces included in the transition layer is different from a pitch of conductive traces included in the layer of the second set.

5. The method of claim 1, wherein the first set of layers includes a subset of layers including connections between one or more of the devices of the semiconductor assembly.

6. The method of claim 5, wherein the layer of the first set comprises a layer of the subset of layers including connections between one or more of the devices of the semiconductor assembly.

7. The method of claim 1, wherein a layer of the second set of layers on the second wafer includes at least one passive component.

8. The method of claim 7, wherein a passive component comprises a capacitor.

9. The method of claim 8, wherein the capacitor comprises a super high density metal-insulator-metal capacitor.

10. The method of claim 7, wherein a passive component comprises an inductor.

11. A semiconductor device comprising:
    a first set of layers, one or more layers of the first set including one or more devices;
    a second set of layers, a layer of the second set coupled to a layer of the first set using metal to metal hybrid bonding, one or more layers of the second set including connections between one or more of the devices; and
    a transition layer including one or more conductive traces, the layer of the first set coupled to the one or more conductive traces using metal to metal hybrid bonding and the layer of the second set coupled to the one or more conductive traces using metal to metal hybrid bonding.

12. The semiconductor device of claim 11, wherein a pitch of the one or more conductive traces included in the transition layer is different from a pitch of conductive traces included in the layer of the first set.

13. The semiconductor device of claim 12, wherein the pitch of the one or more conductive traces included in the transition layer is different from a pitch of conductive traces included in the layer of the second set.

14. The semiconductor device of claim 11, wherein the first set of layers includes a subset of layers including connections between one or more of the devices.

15. The semiconductor device of claim 14, wherein the layer of the first set comprises a layer of the subset of layers including connections between one or more of the devices.

16. The semiconductor device of claim 11, wherein a layer of the second set of layers includes at least one passive component.

17. The semiconductor device of claim 16, wherein a passive component comprises a capacitor.

18. The semiconductor device of claim 16, wherein a passive component comprises an inductor.

\* \* \* \* \*